United States Patent
Rzeznik et al.

(10) Patent No.: US 9,234,282 B2
(45) Date of Patent: Jan. 12, 2016

(54) PLATING CATALYST AND METHOD

(71) Applicant: Rohm and Haas Electronic Materials LLC, Marlborough, MA (US)

(72) Inventors: Maria Anna Rzeznik, Shrewsbury, MA (US); Feng Liu, Ashland, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 45 days.

(21) Appl. No.: 14/090,571

(22) Filed: Nov. 26, 2013

(65) Prior Publication Data

US 2014/0083860 A1    Mar. 27, 2014

Related U.S. Application Data

(62) Division of application No. 12/968,222, filed on Dec. 14, 2010, now Pat. No. 8,591,637.

(51) Int. Cl.
| | |
|---|---|
| *C23C 18/30* | (2006.01) |
| *B05D 5/12* | (2006.01) |
| *C23C 18/16* | (2006.01) |
| *C23C 18/18* | (2006.01) |
| *C23C 18/20* | (2006.01) |
| *C23C 28/02* | (2006.01) |
| *H05K 3/42* | (2006.01) |
| *C23C 18/40* | (2006.01) |

(52) U.S. Cl.
CPC ......... *C23C 18/1646* (2013.01); *C23C 18/1639* (2013.01); *C23C 18/1653* (2013.01); *C23C 18/1875* (2013.01); *C23C 18/2086* (2013.01); *C23C 18/30* (2013.01); *C23C 28/02* (2013.01); *C23C 18/405* (2013.01); *H05K 3/42* (2013.01); *H05K 2203/0716* (2013.01)

(58) Field of Classification Search
USPC ............ 106/1.11, 1.18, 1.19, 1.21; 427/99.5, 427/123, 405, 437, 443.1; 205/187
See application file for complete search history.

(56) References Cited

U.S. PATENT DOCUMENTS

| | | | | |
|---|---|---|---|---|
| 3,523,874 | A * | 8/1970 | Dey | 205/187 |
| 3,793,038 | A * | 2/1974 | Maguire | 427/443.1 |
| 4,248,632 | A * | 2/1981 | Ehrich et al. | 106/1.11 |
| 4,301,196 | A * | 11/1981 | McCormack et al. | 427/99.1 |
| 4,493,861 | A * | 1/1985 | Sirinyan et al. | 427/304 |
| 4,634,468 | A * | 1/1987 | Gulla et al. | 106/1.11 |
| 5,165,971 | A * | 11/1992 | Falletti | 427/443.1 |
| 5,173,130 | A * | 12/1992 | Kinoshita et al. | 148/268 |
| 5,300,140 | A * | 4/1994 | Wolf et al. | 106/1.11 |
| 5,503,877 | A * | 4/1996 | Stamp et al. | 427/99.5 |
| 5,518,760 | A * | 5/1996 | Ferrier et al. | 427/99.5 |
| 6,325,910 | B1 * | 12/2001 | Meyer et al. | 205/159 |
| 8,591,637 | B2 * | 11/2013 | Rzeznik et al. | 106/1.11 |
| 2003/0000846 | A1 * | 1/2003 | Rzeznik et al. | 205/263 |
| 2004/0040852 | A1 * | 3/2004 | Rzeznik et al. | 205/86 |
| 2005/0153059 | A1 * | 7/2005 | Wakizaka | 427/99.5 |
| 2007/0219083 | A1 * | 9/2007 | Zhang et al. | 502/150 |
| 2012/0145554 | A1 * | 6/2012 | Liu et al. | 205/187 |

FOREIGN PATENT DOCUMENTS

WO    WO 2010/004856 A1 *   1/2010

OTHER PUBLICATIONS

Polavarapu et al., "A single step synthesis of gold nanochains using an amino acid as a capping agent and characterization of their optical properties"; Feb. 2008; pp. 75601 (6pp); vol. 19, No. 7.*

* cited by examiner

*Primary Examiner* — Helene Klemanski
(74) *Attorney, Agent, or Firm* — S. Matthew Cairns

(57) ABSTRACT

Stable zero-valent metal compositions and methods of making and using these compositions are provided. Such compositions are useful as catalysts for subsequent metallization of non-conductive substrates, and are particularly useful in the manufacture of electronic devices.

8 Claims, No Drawings

PLATING CATALYST AND METHOD

This application is a divisional of application Ser. No. 12/968,222, filed on Dec. 14, 2010, now U.S. Pat. No. 8,591,637.

The present invention generally relates to the field of electroless metal plating, and more specifically to the field of catalysts useful in electroless metal plating of non-conductive substrates used in the manufacture of electronic devices.

Printed circuit boards include laminated non-conductive dielectric substrates that rely on drilled and plated through-holes to form connections between opposite sides of the circuit board or between innerlayers of the board. Electroless metal plating is well known for preparing metallic coatings on surfaces. Electroless metal plating of dielectric surfaces requires the prior deposition of a catalyst. A common method used to catalyze or activate laminated non-conductive dielectric substrates, prior to electroless plating, is to treat the substrate with an aqueous tin-palladium colloid in an acidic chloride medium. The colloid includes a metallic palladium core surrounded by a stabilizing layer of tin (II) ion complexes, such as $SnCl_3^-$, which act as surface stabilizing groups to avoid agglomeration of the colloids in suspension.

In the activation process, the palladium-based colloid is adsorbed onto an insulating substrate, such as epoxy or polyimide, to activate electroless metal deposition, such as electroless copper deposition. While not wishing to be bound by theory, it is believed that the catalyst particles play roles as carriers in the path of electron transfer from reducing agents to metal ions in the plating bath. Although the performance of electroless plating is influenced by many factors, such as composition of the plating bath and choice of ligand, the activation step is the key factor for controlling the rate and mechanism of electroless deposition.

Although colloidal tin/palladium catalyst has been commercially used as an activator for electroless metal, particularly copper, deposition for decades, it has many shortcomings such as its sensitivity to air and high cost. Along with the reduction in sizes and increase in performance of electronic devices, the packing density of electronic circuits has become higher and subsequently industry standards for quality have increased. As a result of greater demands on reliability and in particular due to the high and fluctuating cost of palladium, alternative catalyst compositions or compositions that use less-expensive metals or that reduce or eliminate the use of precious metals are desired. The stability of the colloidal tin/palladium catalyst is also a concern. As mentioned above, the tin/palladium colloid is stabilized by a layer of tin (II) ions. The counterions may prevent palladium from aggregating but the tin (II) ions are readily oxidized to tin (IV), thus the colloid cannot maintain its colloidal structure. This oxidation is promoted by increases in temperature and by agitation. If the amount of tin (II) is allowed to fall close to zero, then palladium particles grow in size, agglomerate and precipitate and plating stops.

Considerable effort has been made to find new and better electroless plating catalysts. For example, because of the high cost of palladium, much of the effort has been directed toward the development of a non-noble metal catalysts, particularly towards the development of a colloidal copper catalyst. There has also been work directed to the development of a tin-free palladium catalyst since the stannous chloride used to reduce the palladium is costly and the oxidized tin requires a separate step of acceleration. However, such catalysts have not been shown to be sufficiently active or reliable enough for through-hole plating. Furthermore, these catalysts are not sufficiently stable, typically become progressively less active upon standing and the change in activity renders such catalysts unreliable and impractical for commercial use.

Stabilizing moieties for ionic palladium other than tin have been investigated. For example, U.S. Pat. No. 4,248,632 discloses certain pyridine ligands and imidazole ligands as stabilizers for ionic metal catalysts, such as ionic palladium ($Pd^{2+}$). The ionic metal is reduced only after it is adsorbed on the surface of a non-conductive substrate. Other known stabilizing moieties include polyvinyl pyrrolidone (PVP) and other polymers. PVP plays the role of a protecting and stabilizing agent. Metal-ligand moieties where the ligand serves as an effective mechanism for anchoring palladium (II) catalysts to substrates have been reported. Other metal colloids, such as silver/palladium and copper/palladium, using ionic palladium have also been reported. Although alternative catalysts to the conventional tin/palladium catalyst have been developed, these still use ionic palladium and none of these alternatives have provided the necessary stability, activity and adsorption to dielectric surfaces demanded in the manufacture of electronic devices such as printed circuit boards.

The present invention provides a composition including 0.5 to 100 ppm of a zero-valent metal, a stabilizer compound and water; wherein the zero-valent metal is chosen from palladium, silver, cobalt, nickel, gold, copper and ruthenium; wherein the stabilizer compound has the formula

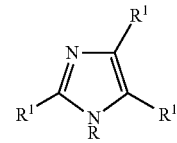

wherein R=H or $(C_1-C_6)$alkyl; each $R^1$ is independently chosen from H, $(C_1-C_6)$alkyl and Z; Z=$(C_2-C_6)$alkenyl-$Z^1$ or $(CR^2R^3)_aZ^1$; each $R^2$ and $R^3$ are independently chosen from H, hydroxyl, $(C_1-C_6)$alkyl, hydroxy$(C_1-C_6)$alkyl, C(O)—$(C_1-C_6)$alkyl, $(C_1-C_6)$alkyl-C(O)—$(C_1-C_6)$alkyl, $CO_2R^4$ and $NR^5R^6$; $R^4$=H, $(C_1-C_6)$alkyl, hydroxy$(C_1-C_6)$alkyl or $(C_1-C_4)$alkoxy$(C_1-C_6)$alkyl; $R^5$ and $R^6$ are independently chosen from H, $(C_1-C_6)$alkyl and $(CR^2R^3)_aZ^2$; $Z^1$=C(S)SH, $CO_2H$, or C(O)$NR^5R^6$; $Z^2$=C(O)$R^4$ or $CO_2R^4$; and a=0-6; wherein at least one $R^1$ is Z.

The present invention also provides a method of preparing the above composition including combining the stabilizer compound, water and a water-soluble metal salt and then adding a sufficient amount of a reducing agent to form the zero-valent metal.

Also provided by the present invention is a method including: (a) providing a substrate having a plurality of through-holes; (b) applying the above composition to the surface of the through-holes; and then (c) depositing a metal on the surface of the through-holes by electroless metal plating.

As used throughout this specification, the following abbreviations shall have the following meanings, unless the context clearly indicates otherwise: ca.=approximately; °C.=degrees Celsius; g=gram; mg=milligram; L=liter; mL=milliliter; ppm=parts per million; μm=micron=micrometer; nm=nanometer; mm=millimeters; DI=deionized; $T_g$=glass transition temperature; R.T.=room temperature; and rpm=revolutions per minute. All amounts are percent by weight ("wt %") and all ratios are molar ratios, unless otherwise noted. All numerical ranges are inclusive and combinable in any order, except where it is clear that such numerical ranges are constrained to add up to 100%.

The term "through-holes" includes blind vias. Also as used throughout this specification, the term "plating" refers to electroless metal plating, unless the context clearly indicates otherwise. "Deposition" and "plating" are used interchangeably throughout this specification. The term "alkyl" includes linear, branched and cyclic alkyl. Likewise, the term "alkenyl" includes linear, branched and cyclic alkenyl. "Halide" includes fluoride, chloride, bromide, and iodide. The terms "printed circuit board" and "printed wiring board" are used interchangeably throughout this specification. The articles "a" and "an" refer to the singular and the plural.

The present compositions include a zero-valent metal, a stabilizer compound and water. Preferably, the zero-valent metal and stabilizing compound are present in the composition as stable nanoparticles. More preferably, the present compositions are solutions including stable nanoparticles comprising the zero-valent metal and the stabilizing compound.

The water used in the present compositions may be any type, such as tap water or DI water. Suitable zero-valent metals are those useful as catalysts for electroless metal plating, such as, but not limited to, palladium, silver, cobalt, nickel, gold, copper and ruthenium. Preferably, the zero-valent metal is chosen from palladium, silver, cobalt, nickel, copper and ruthenium, and more preferably palladium, silver, copper, cobalt and nickel. Palladium and silver are most preferred. Mixtures of zero-valent metals may be used, such as a mixture of palladium and silver or a mixture of palladium and copper. The zero-valent metal is present in the composition in an amount of 0.5 to 100 ppm, based on the weight of the composition. Preferably, the zero-valent metal is present in the composition in an amount of 1 to 100 ppm, more preferably from 1 to 75 ppm, still more preferably from 5 to 75 ppm, even more preferably from 5 to 50 ppm, and most preferably from 5 to 35 ppm.

Suitable stabilizer compounds for the zero-valent metal are chosen from compounds of the formula

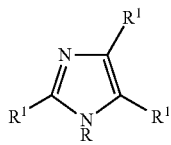

wherein $R=H$ or $(C_1-C_6)$alkyl; each $R^1$ is independently chosen from H, $(C_1-C_6)$alkyl and Z; $Z=(C_2-C_6)$alkenyl-$Z^1$ or $(CR^2R^3)_aZ^1$; each $R^2$ and $R^3$ are independently chosen from H, hydroxyl, $(C_1-C_6)$alkyl, hydroxy$(C_1-C_6)$alkyl, $C(O)-(C_1-C_6)$alkyl, $(C_1-C_6)$alkyl-$C(O)-(C_1-C_6)$alkyl, $CO_2R^4$ and $NR^5R^6$; $R^4=H$, $(C_1-C_6)$alkyl, hydroxy$(C_1-C_6)$alkyl or $(C_1-C_4)$alkoxy$(C_1-C_6)$alkyl; $R^5$ and $R^6$ are independently chosen from H, $(C_1-C_6)$alkyl and $(CR^2R^3)_aZ^2$; $Z^1=C(S)SH$, $CO_2H$, or $C(O)NR^5R^6$; $Z^2=C(O)R^4$ or $CO_2R^4$; and $a=0-6$; wherein at least one $R^1$ is Z. Preferably, $R=H$ or $(C_1-C_3)$alkyl. Preferably, each $R^1$ is independently chosen from H, $(C_1-C_3)$alkyl and Z, and more preferably H and Z. Z is preferably $(C_2-C_4)$ alkenyl-$Z^1$ or $(CR^2R^3)_aZ^1$. It is preferred that $Z^1=CO_2H$, or $C(O)NR^5R^6$. Preferably, $R^2$ and $R^3$ are independently chosen from H, $(C_1-C_3)$alkyl, $CO_2R^4$ and $NR^5R^6$. $R^4$ is preferably H or $(C_1-C_3)$alkyl, more preferably H or $CH_3$, and still more preferably H. It is preferred that $R^5$ and $R^6$ are independently chosen from H, $(C_1-C_3)$alkyl and $(CR^2R^3)_aZ^2$, more preferably from H, $CH_3$ and $(CR^2R^3)_aZ^2$, and even more preferably H. $Z^2$ is preferably $CO_2R^4$, and more preferably $CO_2H$. It is preferred that $a=0-4$, more preferably $a=1-4$, and still more preferably $a=1-3$. The stabilizing compounds are generally commercially available, such as from Sigma-Aldrich (St. Louis, Mo.), or may be prepared by methods known in the art. These compounds may be used as-is or may be further purified.

Particularly suitable stabilizer compounds include, but are not limited to: histidine (4-(2-amino-2-carboxyethyl)imidazole); urocanic acid (4-imidazoleacrylic acid); 4,5-imidazoledicarboxylic acid; 4-imidazoleacetic acid; 4-imidazolecarboxylic acid; 1-methyl-2-imidazolecarboxylic acid; 4,5-imidazoledicarboxylic acid diamide; 1H-imidazole-4-carboxamide; and 4-imidazoleacrylamide. Preferred stabilizers include: histidine; urocanic acid; 4,5-imidazoledicarboxylic acid; 4-imidazoleacetic acid; 4-imidazolecarboxylic acid; and 1-methyl-2-imidazolecarboxylic acid.

The present compositions contain the zero-valent metal and the stabilizing compound in a molar ratio of 1:1 to 1:20. Preferably, the molar ratio of the zero-valent metal to the stabilizing compound is from 1:5 to 1:20, and more preferably from 1:10 to 1:20.

Optionally, the present compositions may contain one or more of various additives common in electroless plating catalyst compositions, such as surfactants, buffers, pH adjusting agents, solubility aids such as organic solvents. Mixtures of various additives may be used, such as a pH adjusting agent and a buffer. Any suitable surfactants may be used, including anionic, non-ionic, cationic and amphoteric surfactants. Such surfactants may be present in an amount of from 0 to 25 ppm, based on the weight of the composition. When present, it is preferred that the amount of the surfactant is from 0.5 to 25 ppm and more preferably from 1 to 10 ppm. Buffering agents which may be used include, but are not limited to, carboxylic acids, such as citric acid, tartaric acid, succinic acid, malic acid, malonic acid, maleic acid, lactic acid, acetic acid and salts thereof; amines and salts thereof; and amino acids and salts thereof; and inorganic acids, such as boric acid, and their salts, and inorganic bases such as sodium bicarbonate. Compounds which may be included to adjust the pH include, but are not limited to, alkali metal hydroxides, such as sodium and potassium hydroxide, and acids such as mineral acids. When used, the optional buffering agents and pH adjusting agents are used in amounts sufficient to adjust the pH to a desired range.

Typically, the present compositions have a pH of 6-14. Preferably, the present compositions are alkaline, that is they have a pH of from >7 to 14, more preferably they have a pH of from 7.5 to 14, even more preferably 7.5 to 10, and still more preferably 8 to 10.

The present compositions are stable aqueous solutions of nanoparticles that are useful to catalyze electroless metal deposition in the manufacture of electronic components. By "stable" is meant that no precipitate formation is visually observed upon storage at 20° C. for 3 months. Preferably, the present compositions show no precipitate after 6 months, and more preferably after 1 year storage at 20° C. These nanoparticles may have a variety of particle sizes. If the particle sizes become too large, the compositions may not be stable, that is, precipitation may occur. Suitable average particle sizes may be from 1 nm to 1 μm, preferably from 1 nm to 500 nm, more preferably from 1 nm to 100 nm. Particle sizes may be determined by known techniques, such as by light scattering or transmission electron microscopy.

The compositions of the present invention may be prepared by combining the stabilizer compound, water, a water-soluble metal salt and a reducing agent. Preferably, the stabilizer compound, water, and the water-soluble metal salt are combined and then a reducing agent is added. The amount of reducing agent used is any amount sufficient to form the desired zero-valent metal. The stabilizer compound, water and water-soluble metal salt may be added in any order. Typically, the water-soluble salt is dissolved in an amount of water. This salt solution is then added to an aqueous solution of the stabilizing agent. The mixture is then stirred, typically at room temperature (ca. 20° C.), and the pH is adjusted as needed. Typically, stir bar agitation may be used for small volumes, such as up to 200 mL. Homogenizers may be used for larger volumes. Typical mixing rates may be from 3000 to 25000 rpm. A PowerGen™ 700 homogenizer by Fisher Scientific is an example of an apparatus which may be used. Next, the reducing agent is added to the mixture and stirring is continued. When palladium is used as the zero-valent metal, the catalyst solution is typically brown to black in color after reduction. Following reduction, it is believed that stable nanoparticles comprising the stabilizing agent and the zero-valent metal are formed.

A variety of metal salts may be used provided that such metal salts are sufficiently water-soluble. Suitable metal salts include metal halides, metal nitrates, metal nitrites, metal oxides, metal acetates, metal gluconates, metal fluoroborates, metal alkylsulfonates, metal sulfates, metal sulfites, metal thiosulfates, metal thiocyanates, and metal cyanides. Exemplary metal salts include, without limitation, palladium chloride, palladium sodium chloride, palladium potassium chloride, palladium ammonium chloride, palladium sulfate, palladium nitrate, palladium acetate, palladium oxide, silver nitrate, silver oxide, cobalt acetate, cobalt chloride, cobalt nitrate, cobalt sulfate, nickel sulfate, nickel methanesulfonate, nickel acetate, nickel fluoroborate, gold chloride, potassium gold cyanide, gold sulfite, gold thiosulfate, gold thiocyanate, copper sulfate, copper gluconate, copper acetate, copper nitrate, ruthenium chloride, ruthenium porphyrins, and ruthenium oxide. The amount of metal salts used will vary depending on the water solubility of the particular metal salt. For example, palladium salts may be used in amounts of 5 mg/L to 10 g/L, and preferably from 100 mg/L to 5 g/L.

A variety of reducing agents my be used to form the present compositions. Suitable reducing agents include, but are not limited to, compounds such as boron hydride compounds, such as amineboranes, such as dimethylamine borane (DMAB), trimethylamine borane, isopropylamineborane and morpholineborane, sodium borohydride and potassium borohydride, hypophosphorus acid, ammonium, lithium, sodium potassium and calcium salts thereof, formaldehyde, hypophosphites, such as sodium hypophosphite, hydrazine anhydride, carboxylic acids, such as formic acid and ascorbic acid, and reducing sugars, such as glucose, galactose, maltose, lactose, xylose and fructose. The amount of reducing agent used depends upon the amount of the metal salt in the composition. Typically, the reducing agents may be used in amounts of 5 mg/L to 500 mg/L, preferably in amounts of 20 mg/L to 200 mg/L.

Because the catalyst compositions contain a zero-valent metal, such as $Pd^0$, processes using these compositions avoid the need for a reducing step prior to electroless metal plating. In addition, the compositions enable good adhesion of metal to substrates. The compositions are tin-free, thus avoiding the problems associated with tin (II) ions readily oxidizing to tin (IV) and disrupting the catalyst. The problem with ionic palladium particles growing in size and agglomerating and precipitating is also greatly reduced and preferably avoided altogether. Since tin is excluded from the composition, the cost of the catalyst composition is reduced because costly stannous chloride is no longer required. Further, the acceleration step required when using tin is avoided in preparation of a substrate for metallization, thereby eliminating a conventional step in the preparation of non-conductive substrates for metallization.

Compositions of the invention may be used as catalysts in electroless metal plating of substrates which include inorganic and organic materials such as glass, ceramics, porcelain, resins, paper, cloth, and combinations thereof. Substrates also include metal-clad and unclad materials, such as printed circuit boards. Such printed circuit boards include metal-clad and unclad substrates with thermosetting resins, thermoplastic resins and combinations thereof, and may further include fibers, such as fiberglass, and impregnated embodiments of the foregoing. The temperatures and time periods for the method steps for metallization of the substrates are conventional and are well known in the art.

Thermoplastic resins include, but are not limited to: acetal resins; acrylics such as methyl acrylate, methyl methacrylate, ethyl acrylate, ethyl methacrylate, butyl acrylate and copolymers containing any of the foregoing; cellulosic resins such as cellulose propionate, cellulose acetate butyrate and cellulose nitrate; polyethers; nylon; polyethylene; polystyrene; styrene blends such as acrylonitrile styrene and copolymers and acrylonitrile-butadiene styrene copolymers; polycarbonates; polychlorotrifluoroethylene; and vinylpolymers and copolymers such as vinyl acetate, vinyl alcohol, vinyl butyral, vinyl chloride, vinyl chloride-acetate copolymer, vinylidene chloride and vinyl formal.

Thermosetting resins include, but are not limited to, allyl phthalate, furane, melamine-formaldehyde, phenol-formaldehyde and phenol-furfural copolymers, alone or compounded with butadiene acrylonitrile copolymers or acrylonitrile-butadiene-styrene copolymers, polyacrylic esters, silicones, urea formaldehydes, epoxy resins, allyl resins, glyceryl phthalates and polyesters.

The present compositions may be used to catalyze both low and high $T_g$ resins. Low $T_g$ resins have a $T_g$ below 160° C. and high $T_g$ resins have a $T_g$ of 160° C. and above. Typically, high $T_g$ resins have a $T_g$ of 160° C. to 280° C. or such as from 170° C. to 240° C. High $T_g$ polymer resins include, but are not limited to, polytetrafluoroethylene ("PTFE") and PTFE blends. Exemplary blends include PTFE with polyphenylene oxides and cyanate esters. Other classes of polymer resins which include high $T_g$ resins are epoxy resins, such as difunctional and multifunctional epoxy resins, bimaleimide/triazine and epoxy resins (BT epoxy), epoxy/polyphenylene oxide resins, acrylonitrile butadienestyrene, polycarbonates (PC), polyphenylene oxides (PPO), polypheneylene ethers (PPE), polyphenylene sulfides (PPS), polysulfones (PS), polyamides, polyesters such as polyethyleneterephthalate (PET) and polybutyleneterephthalate (PBT), polyetherketones (PEEK), liquid crystal polymers, polyurethanes, polyetherimides, epoxies and composites thereof.

In one embodiment, the present compositions may be used to deposit the zero-valent metal on the walls of through-holes. These compositions may be used in both horizontal and vertical processes of manufacturing printed circuit boards.

Through-holes are generally formed in a printed circuit board by drilling or punching or any other method known in the art. After the formation of the through-holes, the boards are optionally rinsed with water and a conventional organic solution is used to clean and degrease the board followed by desmearing the through-hole walls. Desmearing is well-known in the art and typically desmearing of the through-holes begins with application of a solvent swell.

Solvent swells are well-known in the art and conventional solvent swells may be used to desmear the through-holes. Such solvent swells, typically include, without limitation, glycol ethers and their associated ether acetates. Conventional amounts of glycol ethers and their associated ether acetates may be used. Examples of commercially available solvent swells which may be used are CIRCUPOSIT™ conditioner 3302, CIRCUPOSIT™ hole prep 3303 and CIRCUPOSIT™ hole prep 4120, all commercially available from Dow Electronic Materials, Marlborough, Mass.

Optionally, the through-holes are next rinsed with water. An oxidizer is then typically applied to the through-holes. Suitable oxidizers include, but are not limited to, sulfuric acid, chromic acid, alkaline permanganate or by plasma etching. Typically alkaline permanganate is used as the oxidizer. An example of a commercially available oxidizer is CIRCUPOSIT™ promoter 4130 commercially available from Dow Electronic Materials.

Optionally, the through-holes are rinsed again with water. A neutralizer is then typically applied to the through-holes to neutralize any acid residues or basic residues left by the oxidizer. Conventional neutralizers may be used. Typically, the neutralizer is an aqueous alkaline solution containing one or more amines or a solution of 3 wt % peroxide and 3 wt % sulfuric acid. Optionally, the through-holes are rinsed with water and the printed circuit boards are dried.

After the neutralization step, the substrate (such as a printed circuit board having through-holes) is typically conditioned by applying an alkaline conditioner to the substrate. Such alkaline conditioners include, but are not limited to, aqueous alkaline surfactant solutions containing one or more quaternary amines and polyamines and one or more surfactants. While the surfactants used are conventionally cationic surfactants, other surfactants, such as anionic, nonionic and amphoteric, may be used, as well as combinations of surfactants. In addition, pH adjusters or buffers also may be included in the conditioners. Typically, cationic surfactants are combined with non-ionic surfactants. Surfactants may be present in the conditioners in amounts of 0.05 to 5 wt %, and preferably from 0.25 to 1 wt %. Suitable commercially available alkaline conditioners include, but are not limited to, CIRCUPOSIT™ conditioner 231, 813 and 860, all available from Dow Electronic Materials. Optionally, the through-holes are rinsed with water after conditioning.

Cationic surfactants include, but are not limited to, tetraalkylammonium halides, alkytrimethylammonium halides, hydroxyethyl alkyl imidazoline, alkylbenzalkonium halides, alkylamine acetates, alkylamine oleates and alkylaminoethyl glycine.

Non-ionic surfactants include, but are not limited to, aliphatic alcohols such as alcohol alkoxylates. Such aliphatic alcohols have ethylene oxide, propylene oxide, or combinations thereof, to produce a compound having a polyoxyethylene or polyoxypropylene chain within the molecule, i.e., a chain composed of recurring ($-O-CH_2-CH_2-$) groups, or a chain composed of recurring ($-O-CH_2-CH-CH_3$) groups, or combinations thereof. Typically such alcohol alkoxylates are alcohol ethoxylates having carbon chains of 7 to 15 carbons, linear or branched, and 4 to 20 moles of ethoxylate, typically 5 to 40 moles of ethoxylate and more typically 5 to 15 moles of ethoxylate. Many of such alcohol alkoxylates are commercially available. Examples of commercially available alcohol alkoxylates are linear primary alcohol ethoxylates such as NEODOL 91-6, NEODOL 91-8 and NEODOL 91-9 ($C_9$-$C_{11}$ alcohols having an average of 6 to 9 moles of ethylene oxide per mole of linear alcohol ethoxylate) and NEODOL 1-73B ($C_{11}$ alcohol with an average blend of 7 moles of ethylene oxide per mole of linear primary alcohol ethoxylate). All are commercially available from Shell Chemicals.

Anionic surfactants include, but are not limited to, alkylbenzenesulfonates, alkyl or alkoxy napthalenesulfonates, alkyldiphenyl ether sulfonates, alkyl ether sulfonates, alkylsulfuric esters, polyoxyethylene alkyl ether sulfuric esters, polyoxyethylene alkyl phenol ether sulfuric esters, higher alcohol phosphoric monoesters, polyoxyalkylene alkyl ether phosphoric acids (phosphates) and alkyl sulfosuccinates.

Amphoteric surfactants include, but are not limited to, 2-alkyl-N-carboxymethyl or ethyl-N-hydroxyethyl or methyl imidazolium betaines, 2-alkyl-N-carboxymethyl or ethyl-N-carboxymethyloxyethyl imidazolium betaines, dimethylalkyl betaines, N-alkyl-β-aminopropionic acids or salts thereof and fatty acid amidopropyl dimethylaminoacetic acid betaines.

An advantage of the present compositions is that they can be used to deposit a composition containing a zero-valent metal on the surface of the substrate, and particularly on the surface of through-holes in a printed circuit board. Depositing a zero-valent metal on the circuit board eliminates the need for a subsequent reduction step. This eliminates a conventional step in the preparation of non-conductive substrates for metallization.

The conditioning step is followed by micro-etching the through-holes. Conventional micro-etching compositions may be used. Micro-etching provides a micro-roughened copper surface on exposed copper (for example, innerlayers) to enhance subsequent adhesion of deposited electroless and electroplated metal. Micro-etches include, but are not limited to, 60 g/L to 120 g/L sodium persulfate or sodium or potassium oxymonopersulfate and sulfuric acid (2%) mixture, or a sulfuric acid/hydrogen peroxide mixture. An example of a commercially available micro-etching composition is CIRCUPOSIT™ microetch 3330 available from Dow Electronic Materials. Optionally, the through-holes are rinsed with water.

Optionally, a pre-dip is then applied to the micro-etched through-holes. Examples of pre-dips include 2% to 5% hydrochloric acid or an acidic solution of 25 g/L to 75 g/L sodium chloride. Optionally, the through-holes are rinsed with cold water.

The composition of the present invention is then applied to the through-holes to function as a catalyst for electroless metal deposition. The aqueous composition is applied to the through-holes at temperatures from room temperature (ca. 20° C.) to 50° C., typically from room temperature to 40° C. The through-holes optionally may be rinsed with water after application of the catalyst.

The walls of the through-holes are then electrolessly plated with a metal, such as copper, using an electroless metal plating bath. Conventional electroless baths including immersion baths may be used. Such baths are well known in the art. Typically the printed wiring board is placed in an electroless or immersion metal plating bath containing the metal ions of the desired metal to be deposited on the walls of the through-holes. Metals which may be deposited on the walls of the through-holes include, but are not limited to, copper, nickel, gold, silver and copper/nickel alloys. A layer of gold or silver finish using immersion gold or silver may also be deposited over a copper, copper/nickel or nickel deposit on the walls of the through-holes. Preferably, copper, gold or silver is deposited on the walls of the through-holes, and more Preferably copper is deposited on the walls of the through-holes.

After the metal is deposited on the walls of the through-holes, the through-holes are optionally rinsed with water. Optionally, anti-tarnish compositions may be applied to the metal deposited on the walls of the through-holes. Conventional anti-tarnish compositions may be used. An examples of an anti-tarnish composition is ANTI TARNISH™ 7130, commercially available from Dow Electronic Materials. The through-holes may optionally be rinsed by a hot water rinse and then the boards may be dried.

After the through-holes are metal plated with the electroless or immersion metal baths, the substrates may undergo further processing. Further processing may include conventional processing by photoimaging and further metal deposition on the substrates such as electrolytic metal deposition of, for example, copper, copper alloys, tin and tin alloys. Conventional electrolytic metal baths may be used. Such baths are well known in the art.

The present compositions form a stable aqueous solution of zero-valent metal nanoparticles which may be used to catalyze electroless metal deposition of non-conductive substrates, particularly substrates used in the manufacture of electronic components. In addition, the compositions enable good adhesion of metal to substrates. The compositions are tin-free, thus the problems associated with tin (II) ions readily oxidizing to tin (IV) and disrupting the catalyst is avoided. The problem with zero-valent metal particles growing in size and agglomerating and precipitating is also greatly reduced, and preferably eliminated. Since tin is excluded from the composition, the cost of the catalyst is reduced because the costly stannous chloride is no longer required. The acceleration step required when using tin is also avoided in preparation of a substrate for metallization.

EXAMPLE 1

To a beaker containing 36 mL of DI water at room temperature (ca. 20° C.) was added 155 mg of histidine(4-(2-amino-2-carboxyethyl)imidazole) to form a stabilizer solution. Drops of 0.1 N HCl were added until all of the histidine dissolved. To this solution was added, with stirring, 29.4 mg $Na_2PdCl_4$ ($Pd^{+2}$) dissolved in 2 mL of DI. Following addition, the mixture was stirred for ten minutes at room temperature and its pH was adjusted to 5.4. Next, 30 mg $NaBH_4$ in 2 mL DI water was added to the solution with very strong agitation. The solution quickly changed to a black color, indicating the reduction of $Pd^{+2}$ to $Pd^0$.

Accelerated Stability Test:

The above catalyst solution was then placed in a 50° C. water bath for at least 12 hours to further test its stability, after which time the catalyst composition showed no observable precipitate or turbidity.

A working catalyst solution was prepared by diluting the catalyst concentration to 25 ppm with DI water, adjusting the pH to 9.2 with HCl/NaOH, and adding 3 g/L sodium bicarbonate as a buffer. The pH of the catalyst solution was measured using an Accumet™ AB15 pH meter from Fisher Scientific.

EXAMPLE 2

To a beaker containing 38 mL DI water was added 310 mg of histidine. This mixture was warmed to 60° C. to completely dissolve the histdine. After cooling to room temperature (ca. 20° C.), 1 mL of a $1\times10^{-4}$ mol/L solution of AgNO3 was added to the solution. The solution was then stirred for ten minutes and its pH was adjusted to pH 12 using 0.1 N NaOH. With stirring, 0.05 mL of formaldehyde solution (37%) was added to the solution and the solution was then put in a water bath at 60° C. The solution slowly turned to a bright orange color and the color intensified with reaction time. After about thirty minutes, the solution color was deep orange. The reaction continued for one hour at 60° C. The resulting histidine/silver nanoparticle catalyst composition as subjected to the accelerated stability test of Example 1 and no precipitate or turbidity was observed.

EXAMPLE 3

$Na_2PdCl_4$ (138 mg) was dissolved in 100 mL DI water. To this solution was added 80 mg of $CuSO_4.5H_2O$. The solution turned to a bluish-brown color. Next, 73 mg of histidine was added to the solution and solution turned to a yellowish color. The pH of the resulting solution was adjusted to ~5.5 with 0.1 N NaOH. Next, 71 mg of $NaBH_4$ is dissolved in 5 mL DI water. Aliquots (0.5 mL) of the $NaBH_4$ solution was then added to the palladium/copper solution with strong agitation. A color change to black was observed immediately after $NaBH_4$ addition. The resulting catalyst solution was diluted to 250 ppm in Pd and allowed to stir for 30 minutes at room temperature. The catalyst solution was then subjected to the accelerated stability test of Example 1 and no precipitate or turbidity was observed.

EXAMPLE 4

To a beaker containing 36 mL of DI water was added 24.5 mg of urocanic acid (4-imidazoleacrylic acid). The mixture was warmed up 60° C. to completely dissolve the urocanic acid. After cooling down to room temperature, 13.2 mg of $Na_2PdCl_4$ dissolved in 2 mL DI water was added to the solution with stirring. The mixture, which was white in color and turbid, was stirred for thirty minutes at room temperature (ca. 20° C.). Next, 20 mg of $NaBH_4$ dissolved in 2 mL DI water was added to the above mixture with strong agitation. A color change to black was observed immediately after $NaBH_4$ addition. The resulting catalyst solution was allowed to stir for 30 minutes at room temperature. The catalyst solution was then subjected to the accelerated stability test of Example 1 and no precipitate or turbidity was observed.

EXAMPLE 5

The following stabilized nanoparticle compositions are prepared following the general procedures of Examples 1-4. In the following table, "DMAB" refers to dimethylamine borane.

| Stabilizer Compound | Metal Salt | Reducing Agent | Metal:Stabilier (mol:mol) |
| --- | --- | --- | --- |
| 4-imidazoleacetic acid | $AgNO_3$ | $H_2CO$ | 1:10 |
| 4-imidazolecarboxylic acid | $RuCl_3$ | DMAB | 1:20 |
| 4,5-imidazoledicarboxylic acid | $PdSO_4$ | DMAB | 1:15 |
| 1-methyl-2-imidazolecarboxylic acid | $CoSO_4$ | $NaBH_4$ | 1:17 |

EXAMPLE 6

Comparative

The general procedure of Example 1 was repeated except that the following compounds were used as stabilizers: imidazole, 4-methylimidazole, 2-methylimidazole, histamine dihydrochloride and ethyl 4-methyl-5-imidazolecarboxylate. None of the catalyst compositions prepared using these compounds passed the accelerated stability test of Example 1, either forming precipitate or becoming turbid.

EXAMPLE 7

Various printed circuit boards (Nelco-6 epoxy/glass, NP-175 epoxy/glass, 370T, FR-406, TU-752 epoxy/glass, SY-1141, and SY-1000-2 epoxy/glass) were metalized using an electroless copper plating bath according to the following general procedure.

Multiple through-holes were drilled in each of the boards. The average diameter of the through-holes was 1 mm. The through-holes of each board were then desmeared, prepared for electroless copper plating and electrolessly plated with copper in a vertical process as follows:

1. Each board was treated with 240 liters of solvent swell for 7 minutes at 80° C. The solvent swell was an aqueous solution containing 10% diethylene glycol mono butyl ether, and 35 g/L of sodium hydroxide.
2. The boards were then rinsed with cold tap water for 4 minutes at room temperature.
3. The through-holes in each board were then treated with 550 liters of an alkaline oxidizing agent of 50-60 g/L aqueous alkaline permanganate at a pH of 12 for 10 minutes at 80° C.
4. The boards were rinsed with cold tap water for 4 minutes at room temperature.
5. The though-holes in the boards were then treated with 180 liters of an aqueous neutralizer composed of 3 wt % hydrogen peroxide and 3 wt % sulfuric acid at 50° C. for 5 minutes.
6. The boards were then rinsed with cold tap water for 4 min
7. The boards were then treated with CONDITIONER™ 860 alkaline conditioner which included a cationic surfactant and buffer system to maintain a pH of around 11. The alkaline conditioners are commercially available from Dow Electronic Materials. Whether a conditioner was needed depended upon the particular stable zero-valent metal nanoparticle catalyst employed.
8. The conditioned boards from step 7 were then rinsed with cold tap water for 4 minutes at room temperature.
9. The through-holes of each board were then micro-etched with 100 liters of an aqueous alkaline solution of 20 g/L ammonium persulfate for 2 minutes at room temperature.
10. The boards were then rinsed with cold tap water for 4 minutes at room temperature.
11. A pre-dip of 5% concentrated hydrochloric acid was then applied to the through-holes for 1 minute at room temperature.
12. The boards were then rinsed with cold tap water for 1 minute at room temperature.
13. Certain boards had their through-holes primed for electroless copper plating with 2 liters of a composition of the invention for 5 minutes at 40° C. The concentration of the zero-valent metal nanoparticles was 25 ppm. The pH of the catalyst was generally 9.6. Other boards were primed with 2 liters of a conventional tin/palladium catalyst with a palladium particle concentration of 25 ppm for 5 min. at 40° C. as a control. The conventional catalyst had the following formulation: 1 g palladium chloride; 300 mL concentrated HCl; 1.5 g sodium stannate; 40 g tin chloride; and water to one liter.
14. The boards were then rinsed with cold tap water for 2.5 min at room temperature.
15. The walls of the through-holes of the boards were then plated with electroless copper for 15 minutes at 36° C. The electroless copper bath had the following formulation:

| COMPONENT | AMOUNT |
| --- | --- |
| Copper sulfate Pentahydrate | 2 g |
| Formaldehyde | 2.5 g |
| Sodium hydroxide | 5 g |
| Ethylene diamine tetraacetate (EDTA) | 25 g |
| Chloride ions | 5 g |
| 2,2-Dipyridyl | 2 ppm |
| Water | To one liter |

16. After electroless copper deposition, the boards were rinsed with cold tap water for 4 min at room temperature.

Each board was sectioned laterally to expose the copper plated walls of the through-holes. Multiple lateral sections 1 mm thick were taken from the walls of the sectioned through-holes of each board to determine the through-hole wall coverage for the boards using the European Backlight Grading Scale. Section (1 mm) from each board were placed under an Olympus GX71 optical microscope of 50× magnification. The quality of the copper deposit was determined by the amount of light that was observed under the microscope. The backlight results showed that the catalyst compositions of the present invention were comparable to the conventional ionic tin/palladium (Sn/Pd) catalyst.

What is claimed is:

1. A method comprising:
   (a) providing a substrate having a plurality of through-holes;
   (b) applying a composition comprising 0.5 to 100 ppm of a zero-valent metal, a stabilizer compound and water; wherein the zero-valent metal is selected from the group consisting of palladium, silver, cobalt, nickel, gold, copper and ruthenium; wherein the stabilizer compound has the formula

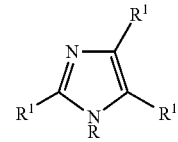

wherein R=H or $(C_1\text{-}C_6)$alkyl; each $R^1$ is independently selected from the group consisting of H, $(C_1\text{-}C_6)$alkyl and Z; Z=$(C_2\text{-}C_6)$alkenyl-$Z^1$ or $(CR^2R^3)_aZ^1$; each $R^2$ and $R^3$ are independently selected from the group consisting of H, hydroxyl, $(C_1\text{-}C_6)$alkyl, hydroxy$(C_1\text{-}C_6)$alkyl, C(O)—$(C_1\text{-}C_6)$alkyl, $(C_1\text{-}C_6)$alkyl-C(O)—$(C_1\text{-}C_6)$alkyl, $CO_2R^4$ and $NR^5R^6$; $R^4$=H, $(C_1\text{-}C_6)$alkyl, hydroxy$(C_1\text{-}C_6)$alkyl or $(C_1\text{-}C_4)$alkoxy$(C_1\text{-}C_6)$alkyl; $R^5$ and $R^6$ are independently selected from the group consisting of H, $(C_1\text{-}C_6)$alkyl and $(CR^2R^3)_aZ^2$; $Z^1$=C(S)SH, $CO_2H$, or C(O)NR$^5R^6$; $Z^2$=C(O)$R^4$ or $CO_2R^4$; and a=0-6; wherein at least one $R^1$ is Z to the surface of the through-holes; and then
   (c) electrolessly depositing a metal on the surface of the through-holes;
wherein the composition has a pH of from >7 to 14; and wherein the composition is free of precipitate for 3 months upon storage at 20° C.

2. The method of claim 1 wherein the pH is 7.5 to 14.
3. The method of claim 1 wherein the zero-valent metal and the stabilizer compound are in a molar ratio of from 1:1 to 1:20.

4. The method of claim 1 wherein $Z^1$=$CO_2H$.

5. The method of claim 1 further comprising the step of contacting the surface of the through-holes with an oxidizing agent prior to step (b).

6. The method of claim 1 wherein the metal is selected from the group consisting of copper, nickel, gold, silver and copper/nickel alloys.

7. The method of claim 1 further comprising a step of electrolytically depositing a second metal onto the electrolessly deposited metal of step (c).

8. The method of claim 7 wherein the second metal is selected from the group consisting of copper, copper alloys, tin and tin alloys.

* * * * *